(12) United States Patent
Leach et al.

(10) Patent No.: US 10,896,805 B2
(45) Date of Patent: Jan. 19, 2021

(54) METHODS FOR RAPID ELECTRON AREA MASKING (REAM) LITHOGRAPHY

(71) Applicant: Gary William Leach, Coquitlam (CA)

(72) Inventors: Gary William Leach, Coquitlam (CA); Finlay Charles Henry MacNab, Vancouver (CA)

(73) Assignee: Gary William Leach, Coquitlam (CA)

( * ) Notice: Subject to any disclaimer, the term of this patent is extended or adjusted under 35 U.S.C. 154(b) by 0 days.

(21) Appl. No.: 16/374,652

(22) Filed: Apr. 3, 2019

(65) Prior Publication Data

US 2019/0304746 A1 Oct. 3, 2019

Related U.S. Application Data

(60) Provisional application No. 62/652,297, filed on Apr. 3, 2018.

(51) Int. Cl.
| | | |
|---|---|---|
| *H01L 31/00* | (2006.01) | |
| *H01J 37/18* | (2006.01) | |
| *H01J 37/317* | (2006.01) | |
| *H01L 31/0236* | (2006.01) | |
| *H01L 31/18* | (2006.01) | |

(52) U.S. Cl.
CPC .... *H01J 37/3174* (2013.01); *H01L 31/02366* (2013.01); *H01L 31/18* (2013.01)

(58) Field of Classification Search
CPC ............... H01J 37/3174; H01J 37/3175; H01J 37/3045; H01J 37/063; H01J 37/20; H01J 37/26; H01J 37/3056; H01J 37/34; H01J 2237/31794; H01J 2237/31764; H01J 2237/3169; H01J 2237/30455; H01L 31/18; H01L 31/02366; H01L 31/0687; H01L 31/072; H01L 31/0735; H01L 31/0079; H01L 31/035227; H01L 31/0232
See application file for complete search history.

(56) References Cited

U.S. PATENT DOCUMENTS

| | | | |
|---|---|---|---|
| 5,831,272 A | 11/1998 | Utsumi | |
| 6,316,151 B1 | 11/2001 | Kim et al. | |
| 7,517,618 B2 * | 4/2009 | Moriya | ........... B82Y 10/00 430/311 |

(Continued)

OTHER PUBLICATIONS

Beauvais, "Microfabrication technologies for nanodevices", Opto-Canada: SPIE Regional Meeting on Optoelectronics, Photonics, and Imaging, Aug. 29, 2017.

(Continued)

*Primary Examiner* — Nikolay K Yushin
(74) *Attorney, Agent, or Firm* — Clark & Brody LP

(57) ABSTRACT

A method for electron beam lithography. The method may comprise fabricating a multi-layer mask and interposing the multi-layer mask between an electron beam and an energy-sensitive layer to thereby expose the energy-sensitive layer to the electron beam through the mask. Fabricating the multi-layer mask may comprises providing a first mask layer fabricated from a first mask material (e.g. silicon nitride) which defines one or more feature apertures corresponding to features of interest and coating an electron-energy-reducing material (e.g. gold) onto the first mask layer to thereby provide a second mask layer.

20 Claims, 10 Drawing Sheets

(56) References Cited

U.S. PATENT DOCUMENTS 9,557,658 B2 1/2017 Utsumi
2005/0170265 A1* 8/2005 Moriya ................. B82Y 10/00
430/5

OTHER PUBLICATIONS

Utsumi, "Low-Energy E-Beam Proximity Lithography (LEEPL): Is the Simplest the Best?", Jpn. J. Appl. Phys., Dec. 1999, pp. 7046-7051, vol. 38(1999).
Utsumi, "The status of LEEPL: Can it be an alternative solution?", 22nd European Mask and Lithography Conference, Jun. 27, 2006.

* cited by examiner (1)

(2)

(3)

(4)

METHODS FOR RAPID ELECTRON AREA MASKING (REAM) LITHOGRAPHY

REFERENCE TO RELATED APPLICATIONS

This application claims priority from U.S. application No. 62/652,297 filed 3 Apr. 2018, which is hereby incorporated herein by reference.

TECHNICAL FIELD

This technology relates to mask-based lithography using electron beam exposure. Particular non-limiting embodiments of the technology may be used for mask-based lithographic techniques for fabricating other structures or features.

BACKGROUND

There is a general desire to practice mask-based electron beam lithography techniques (e.g. lithographic fabrication techniques) which employ an electron beam to expose an energy-sensitive layer through a mask and to thereby pattern the energy-sensitive layer.

It is known to use a focussed electron beam to pattern an energy-sensitive layer using maskless lithography techniques, where the focussed electron beam writes directly onto a portion (e.g. a pixel) of the energy-sensitive layer. This maskless electron beam lithography is complex, expensive and time consuming to implement because of the need to separately address the focussed electron beam onto each portion (e.g. onto each pixel) of the energy-sensitive layer.

There is a desire to practice mask-based electron beam lithography, where a mask may be interposed between an electron beam and an energy-sensitive layer, so that a less-focussed electron beam may be used to simultaneously pattern a relatively large area of the energy-sensitive layer. A challenge with using electron beams for such mask-based lithographic techniques is a tendency for the electrons to penetrate the mask and expose regions of the energy-sensitive layer where no exposure is desired.

One prior art technique for mask-based electron lithography involves the use of a thick (e.g. greater than 1 μm) mask. However, a drawback with such a thick mask is that the thickness of the mask imposes a lower limit on the feature size which may be patterned through the mask. For example, using such thick masks, feature sizes may be limited to a minimum of around several hundreds of nanometers. There is a general desire to practice mask-based electron beam lithography which enables feature sizes that are as small as possible.

Another prior art technique for mask-based electron lithography involves the use of a relatively thin mask, but maintains the energy of the electron beams used for exposure at a relatively low level (e.g. 2 keV). With such low energy techniques, it is possible to use thinner masks and, consequently, to achieve smaller feature sizes. However, a drawback with such low-energy techniques is that it limits the suite of energy-sensitive materials that can be used with the technology while achieving desirable exposure times.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention provides a method for electron beam lithography. The method may comprise fabricating a multi-layer mask and interposing the multi-layer mask between an electron beam and an energy-sensitive layer to thereby expose the energy-sensitive layer to the electron beam through the mask. Fabricating the multi-layer mask may comprise providing a first mask layer fabricated from a first mask material (e.g. silicon nitride) which defines one or more feature apertures corresponding to features of interest and coating an electron-energy-reducing material (e.g. Au) onto the first mask layer to thereby provide a second mask layer.

Another aspect of the invention provides a multi-layer mask for use in electron beam lithography. The mask multi-layer mask comprises a first mask layer fabricated from a first mask material which defines one or more feature apertures corresponding to features of interest, and an electron-energy-reducing material coated onto the first mask layer to thereby provide a second mask layer.

In some embodiments, fabricating the multi-layer mask comprises providing a third scaffolding mask layer fabricated from a third mask material (e.g. silicon), the third scaffolding mask layer on a side of the second mask layer opposite from the first mask layer.

In some embodiments, the electron-energy-reducing material is capable of at least one of: scattering electrons and absorbing electrons.

In some embodiments, the third scaffolding mask layer is thicker than either of the first and second mask layers to provide structural integrity to the multi-layer mask. In some embodiments, the third scaffolding mask layer is thicker, by an order of magnitude, than either of the first and second mask layers. In some embodiments, the third scaffolding mask layer has a thickness greater than 50 μm. In some embodiments, the third scaffolding mask layer has a thickness in a range of 50 μm-500 μm.

In some embodiments, the third scaffolding mask layer is fabricated from one or more of: silicon and oxides of silicon.

In some embodiments, the third scaffolding mask layer defines one or more scaffolding apertures. In some embodiments, the one or more scaffolding apertures are larger (in cross-sectional area) than the one or more feature apertures. In some embodiments, the one or more scaffolding apertures have cross-sectional dimensions which are greater than the one or more feature apertures.

In some embodiments, the first mask layer is electrically insulating, relative to the second mask layer.

In some embodiments, the first mask layer is thicker than the second mask layer. In some embodiments, the first mask layer is thicker, by an order of magnitude, than the second mask layer. In some embodiments, the first mask layer has a thickness greater than 100 nm. In some embodiments, the first mask layer has a thickness in a range of 100 nm-500 nm.

In some embodiments, the first mask layer comprises silicon nitride. In some embodiments, the first mask layer is fabricated from silicon nitride.

In some embodiments, the one or more feature apertures have maximum dimensions less than 500 nm. In some embodiments, the one or more feature apertures have maximum dimensions less than 100 nm. In some embodiments, the one or more feature apertures have maximum dimensions less than 50 nm. In some embodiments, the one or more feature apertures have maximum dimensions less than 10 nm.

In some embodiments, the second mask layer has a thickness greater than 10 nm. In some embodiments, the second mask layer has a thickness in a range of 10 nm-100 nm.

In some embodiments, the second mask layer comprises one or more metals. In some embodiments, the second mask layer comprises one or more metal oxides.

In some embodiments, the second mask layer comprises gold (Au). In some embodiments, the second mask layer is fabricated from gold (Au).

In some embodiments, the electron beam has an energy greater than 5 keV. In some embodiments, the electron beam has an energy greater than 10 keV. In some embodiments, the electron beam has an energy greater than 14 keV.

Another aspect of the invention provides a multi-layer mask for use in electron beam lithography. The mask having any of the features, combinations of features or sub-combinations of features of any of the other aspects herein.

Another aspect of the invention provides a method of fabricating a photovoltaic device. The method comprises fabricating a plasmonic metal surface comprising a film and a plurality of nano-pillars extending from a surface of the film using a method for electron beam lithography described herein, fabricating an overlayer over the plasmonic metal surface, the overlayer comprising a p-doped layer and an n-doped layer, and fabricating a top contact over the overlayer.

In some embodiments, the film and the plurality of nano-pillars comprise a single-crystal silver film and single-crystal silver nano-pillars.

In some embodiments, the p-doped layer comprises an epitaxially grown single crystal silicon p-doped layer. In some embodiments, the epitaxially grown single crystal silicon p-doped layer is fabricated using a method for electron beam lithography described herein. In some embodiments, the n-doped layer comprises an epitaxially grown single crystal silicon n-doped layer. In some embodiments, the epitaxially grown single crystal silicon n-doped layer is fabricated using a method for electron beam lithography described herein.

Another aspect of the invention provides a method of fabricating architectural glass. The method comprises patterning light-interacting surface features on a glass substrate using a method for electron beam lithography described herein. In some embodiments the light-interacting surface features comprise subwavelength-spaced optically thin elements.

Another aspect of the invention provides a method of fabricating flat optics devices comprising patterning light-interacting surface features on a substrate using a method for electron beam lithography described herein. In some embodiments, the light-interacting surface features comprise subwavelength-spaced optically thin elements.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

One aspect of the invention provides a method for electron beam lithography. The method may be referred to as Rapid Electron Area Masking (REAM). REAM may comprise patterning of electron beam lithography resists masked with a patterned multi-layer mask (also referred to herein as a nanostencil) by exposure to electrons. REAM methods described herein contrast with maskless electron beam lithography which involves the use of a focused electron beam spot. The REAM lithography technique combines the speed of traditional collimated UV photolithography with the fidelity of electron beam lithography (EBL) due to the small wavelength of accelerated electrons and their associated sub-nanometre diffraction limit.

The REAM method may comprise fabricating a multi-layer mask and interposing the multi-layer mask between an electron beam and an energy-sensitive layer to thereby expose the energy-sensitive layer to the electron beam through the mask. Fabricating the multi-layer mask may comprise providing a first mask layer fabricated from a first mask material (e.g. silicon nitride) which defines one or more feature apertures corresponding to features of interest and coating an electron-energy-reducing material (e.g. Au) onto the first mask layer to thereby provide a second mask layer.

Figure 1:
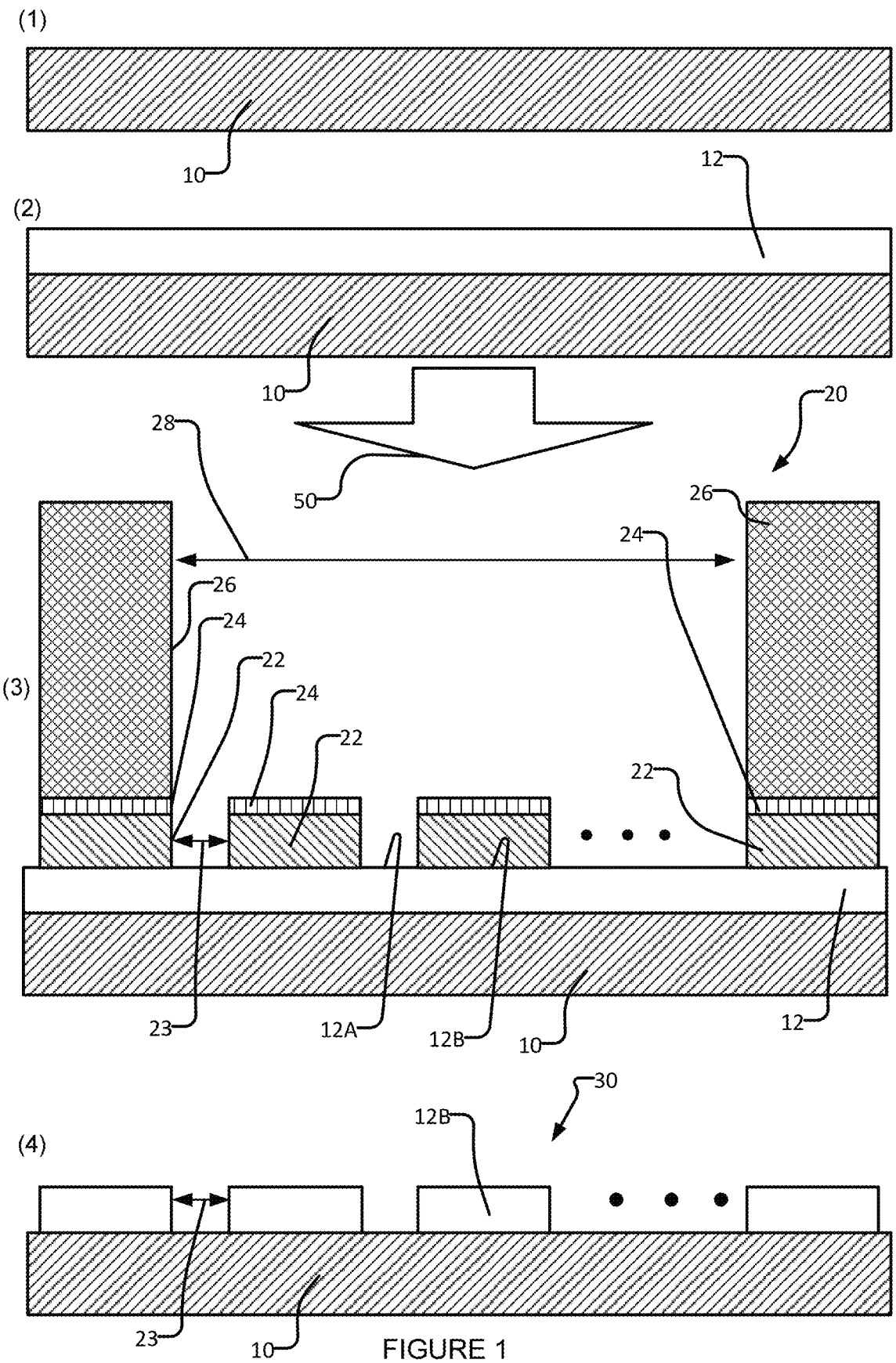
FIG. 1 is a schematic diagram of an exemplary Rapid Electron Area Masking (REAM) method according to one example embodiment of the invention.

FIG. 1 schematically illustrates one exemplary REAM method according to one embodiment of the invention. Step (1) of FIG. 1 shows a substrate 10. Substrate 10 may comprise silicon. Substrate 10 may comprise other suitable materials such as, for example, polymer film, metals, metal oxides, glass, etc. In some embodiments, substrate 10 is fabricated from another material that is known to be used as a substrate for other electron beam lithography or nanofabrication techniques. In some embodiments, substrate 10 comprises a silicon wafer with a native oxide layer. In some embodiments, substrate 10 is coated in metal (e.g. aluminum or silver). In some embodiments substrate 10 is coated with thermally evaporated aluminum. In some embodiments, a metal coating on substrate 10 has a thickness of between 30 nm and 70 nm (e.g. 50 nm). In some embodiments, a metal coating on substrate 10 has a thickness of between 300 nm and 700 nm (e.g. 500 nm).

In step (2) of FIG. 1, an energy-sensitive material 12 is applied to substrate 10. Energy-sensitive material 12 may be referred to as resist 12. Energy-sensitive material 12 may comprise a negative tone resist or a positive tone resist. In some embodiments, energy-sensitive material 12 comprises polymethyl methacrylate (PMMA) such as, for example, PMMA A-6 or PMMA A-2. In some embodiments, energy-sensitive material 12 comprises ma-N 2400 (a high resolution, negative DUV/electron beam resist) produced by MicroChem Corporation. In some embodiments, energy-sensitive material 12 has a thickness of between 40 nm and 60 nm (e.g. 50 nm). In some embodiments, energy-sensitive material 12 has a thickness of between 175 nm and 225 nm (e.g. 200 nm).

In some embodiments, energy-sensitive layer 12 can be a single layer of a commercially available electron beam resist. In some embodiments, energy-sensitive layer 12 may comprise a stack of multiple layers of material that give exposed portions of energy-sensitive layer 12 different geometries (e.g. a mushroom shaped resist layer). Exemplary layers that can be coated in a stack include an adhesion layer to promote good coating of the substrate and a lift-off layer to enable deposition of material into the voids left in the resist layer after development. In some embodiments stacks of three or more different resists can be exposed and developed to form three-dimensional shapes. This may enable fabrication of complex device layers (e.g. for a transmission gate).

In some embodiments, energy-sensitive material 12 is applied to substrate 10 by spin coating. In some embodiments, energy-sensitive material 12 is applied to substrate 10 by spray coating.

In step (3) of FIG. 1, a multi-layer mask 20 is fabricated and interposed between an electron beam 50 and energy-sensitive material 12.

In some embodiments, electron beam 50 comprises an SEM (Scanning Electron Microscope) electron beam (e.g. the electron beam of a FEI/Aspex Explorer SEM or an FEI Nova Nano SEM electron beam at low magnification). In other embodiments, electron beam 50 may be a less focused and/or less expensive electron source such as a cathode ray tube or other known generators of electron beams. A less focussed beam of electrons 50 may be employed due to the use of multi-layer masking 30 which may reduce the need for nanoscale rastering of an electron beam such as is used in previous electron beam lithography techniques. In some embodiments, electron beam 50 has an energy greater than 5 keV. In some embodiments, electron beam 50 has an energy greater than 10 keV. In some embodiments, electron beam 50 has an energy greater than 14 keV.

Multi-layer mask 20 may be fabricated separately from substrate 10 and/or energy-sensitive material 12 and may be attached to substrate 10 and/or energy-sensitive material 12, pressed against substrate 10 and/or energy-sensitive material 12 or placed adjacent to substrate 10 and/or energy-sensitive material 12, as desired. Multi-layer mask 20 may be re-usable.

Multi-layer mask 20 may comprise a first mask layer 22. In some embodiments, first mask layer 22 is a very thin membrane with tiny features etched or milled into it (e.g. like the screen in a screen door). To facilitate stretching or locating first mask layer 22, which may have a thickness between 100-500 nm, across great distances (e.g. 1 cm or hundreds of microns), it may be desirable for first mask layer 22 to be very flat and have very little tendency to twist or bend. This can be achieved if first mask layer 22 has low residual or internal stress. Silicon nitride, for example, can be made with low residual stress on the order of 400-600 MPa. In some embodiments, first mask layer 22 comprises another material or thin film that has low residual stress such as, for example, a diamond-like carbon film. First mask layer 22 may comprise a material or thin film with residual stress in the range of −1.5 GPa to 1.5 GPa. First mask layer 22 may comprise a material or thin film with residual stress in the range of −1.0 GPa to 1.0 GPa.

First mask layer 22 could be made using bi-layer films of equal and opposite residual stress. Negative values of residual stress may result in compressive forces. Positive values of residual stress may result in tensile forces. Residual stress may therefore be balanced in a film by making a bi-layer film (e.g. one layer with positive tensile forces and another layer with negative compressive forces). In such cases, positive residual stress in one film is balanced by negative residual stress in a second film. Together the two films may mimic the properties of a single material film with low residual stress.

Multi-layer mask 20 may comprise a second mask layer 24. In some embodiments, second mask layer 24 is an electron-energy-reducing material. In some embodiments, second mask layer 24 is capable of at least one of: scattering electrons and absorbing electrons. In some embodiments, second mask layer 24 is capable of reducing the amount of electrons from electron beam 50 that pass through multi-layer mask 20 relative to the amount of electrons that exposed energy-sensitive material 12A is exposed to. This relative reduction may be sufficient to achieve a desired contrast in exposure between exposed energy sensitive material 12A and non-exposed energy sensitive material 12B for the purpose of development. In some embodiments, second mask layer 24 comprises one or more metals. In some embodiments, second mask layer 24 comprises one or more metal oxides. In some embodiments, second mask layer 24 is fabricated from or comprises gold. In some embodiments, second mask layer 24 is fabricated from or comprises lead.

In some embodiments, first mask layer 22 is electrically insulating. In some embodiments, first mask layer 22 is electrically insulating, relative to second mask layer 24.

In some embodiments, first mask layer 22 has a thickness greater than 100 nm. In some embodiments, first mask layer 22 has a thickness in a range of 100 nm-500 nm. In some embodiments, first mask layer 22 is thicker than second mask layer 24. In some embodiments, first mask layer 22 is thicker, by an order of magnitude, than second mask layer 24. In some embodiments, second mask layer 24 has a thickness greater than 10 nm. In some embodiments, second mask layer 24 has a thickness in a range of 10 nm-100 nm. In some embodiments, second mask layer 24 has a thickness greater than 100 nm.

In some embodiments, the thickness of second mask layer 24 is dependent on the material of second mask layer 24. For example, for second mask layer 24 materials with greater interaction with electron beam 50 (e.g. gold or lead), a thinner second mask layer 24 may be employed. Conversely, for second mask layer 24 materials with a lesser interaction with electron beam 50 (e.g. iridium or platinum), a thicker second mask layer 24 may be employed. In some embodiments, the thickness of second mask layer 24 is a function of: (1) the chosen material's tendency to absorb and scatter electron beam energy; (2) the chosen material's ability to dissipate that energy as heat; and/or (3) the spectrum and momentum of the secondary electrons that are emitted from second mask layer 24 after exposure to electron beam 50. The thickness and material selection of second mask layer 24 may be chosen to reduce or minimize the flux and energy of the electrons that reach energy-sensitive layer 12 through second mask layer 24. In some embodiments, second mask layer 24 is fabricated from metal elements in period 5 from the periodic table and/or from metal elements in period 6 from the periodic table.

In some embodiments, first mask layer 22 and/or second mask layer 24 define one or more feature apertures 23. In some embodiments, feature apertures 23 have maximum dimensions less than 500 nm. In some embodiments, feature apertures 23 have maximum dimensions less than 100 nm. In some embodiments, feature apertures 23 have maximum dimensions less than 50 nm. In some embodiments, feature apertures 23 have maximum dimensions less than 10 nm.

In some embodiments, first mask layer 22 and second mask layer 24 together are capable of reducing the amount of electrons from electron beam 50 that pass through multi-layer mask 20 relative to the amount of electrons that exposed energy-sensitive material 12A is exposed to. This relative reduction may be sufficient to achieve a desired contrast in exposure between exposed energy sensitive material 12A and non-exposed energy sensitive material 12B for the purpose of development.

Multi-layer mask 20 may optionally comprise a third scaffolding mask layer 26. In some embodiments, fabricating multi-layer mask 20 comprises providing a third scaffolding mask layer 26 fabricated from a third mask material (e.g. silicon). Third scaffolding mask layer 26 may be provided on a side of second mask layer 24 opposite from first mask layer 22 (as shown in FIG. 1). In some embodiments, third scaffolding mask layer 26 may be provided between first mask layer 22 and second mask layer 24 (see FIG. 2). In some embodiments, third scaffolding mask layer 26 is fabricated from one or more of: silicon and oxides of silicon.

In some embodiments, third scaffolding mask layer 26 is thicker than either of first and second mask layers 22, 24 to provide structural integrity to multi-layer mask 20. In some embodiments, third scaffolding mask layer 26 is thicker, by an order of magnitude, than either of first and second mask layers 22, 24. In some embodiments, third scaffolding mask layer 26 has a thickness greater than 50 µm. In some embodiments, third scaffolding mask layer 26 has a thickness in a range of 50 µm-500 µm.

In some embodiments, third scaffolding mask layer 26 defines one or more scaffolding apertures 28. In some embodiments, scaffolding apertures 28 are larger (in cross-sectional area) than feature apertures 23. In some embodiments, the one or more scaffolding apertures 28 have cross-sectional dimensions which are greater than cross-sectional dimensions of feature apertures 23.

In some embodiments, one or more of scaffolding apertures 28 and feature apertures 23 of multi-layer mask 20 are fabricated by focussed ion beam milling. In some embodiments, an FEI/Aspex Explorer SEM is employed for focussed ion beam milling. In some embodiments, scaffolding apertures 28 and feature apertures 23 are fabricated simultaneously. In other embodiments, feature apertures 23 and scaffolding apertures 28 are fabricated separately. In some embodiments, scaffolding apertures are fabricated by etching.

Figure 2:
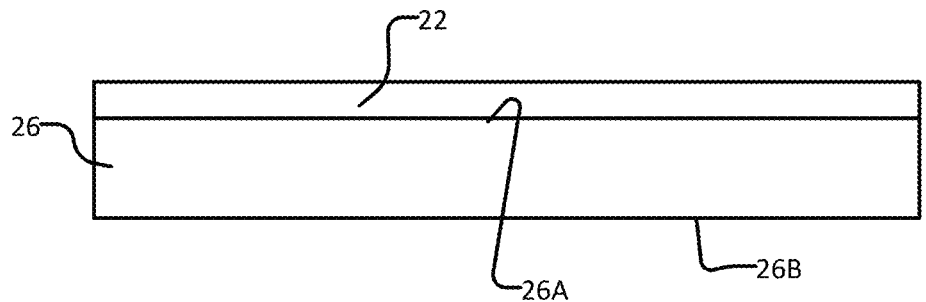
FIG. 2 is a schematic diagram of an exemplary method of fabricating a REAM mask according to one example embodiment of the invention.
Figure 2:
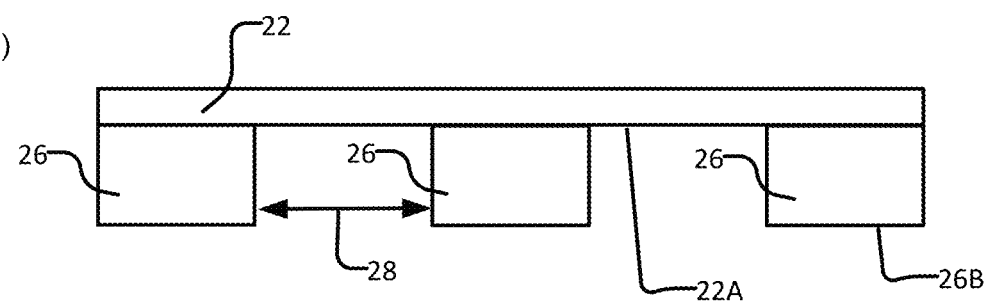
Figure 2:
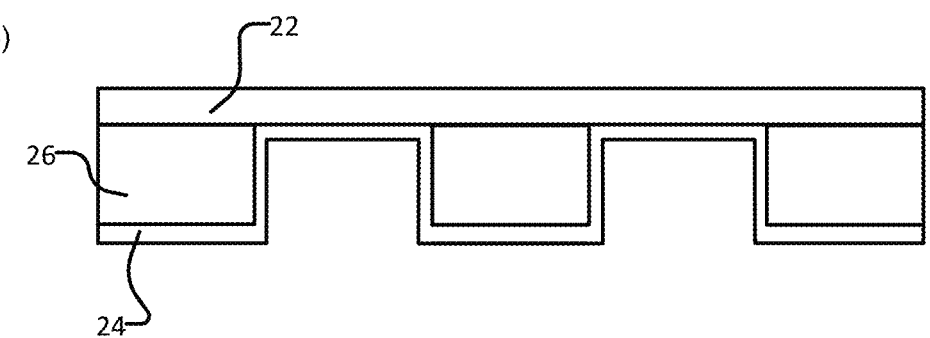
Figure 2:
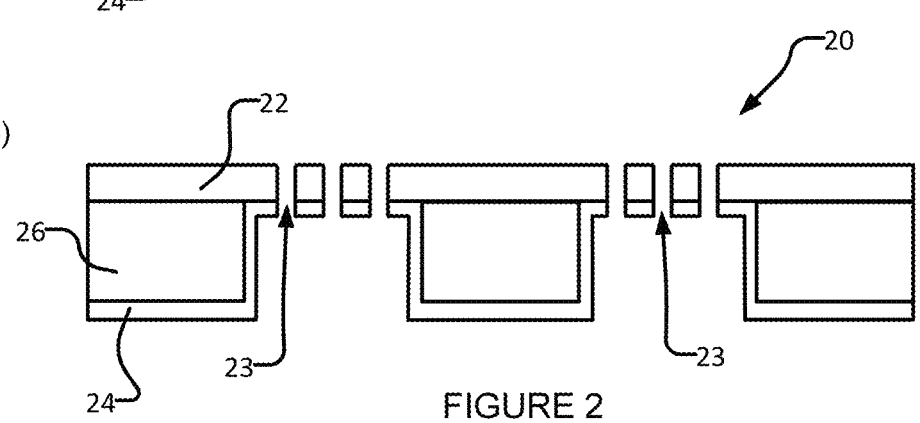

FIG. 2 schematically depicts one method of fabricating a multi-layer mask 20 according to one embodiment of the invention. At step (1) of FIG. 2, a first mask layer 22 (e.g. silicon nitride) is provided on a first side 26A of third scaffolding mask layer 26 (e.g. silicon). First mask layer 22 may be coated on first side 26A of third scaffolding mask layer 26 using any suitable technique (e.g. by deposition). At step (2) of FIG. 2, a portion of third scaffolding mask layer 26 is removed. For example, a second side 26B of third scaffolding mask layer 26 may be etched. In some embodiments, a silicon third scaffolding mask layer 26 may be etched with KOH anisotropic etchant to provide scaffolding apertures 28. At step (3) of FIG. 2, second mask layer 24 may be applied to second side 26B of third scaffolding mask layer 26 and/or exposed surface 22A of first mask layer 22 using any suitable technique. At step (4) of FIG. 2, feature apertures 23 may be formed through first, and second mask layers 22, 24 (e.g. by focussed ion beam milling) to form multi-layer mask 20. In other embodiments, feature apertures 23 may be formed through first and second mask layers 22, 24 separately or in any combination.

Returning to the method of FIG. 1, after exposure by electron beam 50, multi-layer mask 20 may be removed from substrate 10 and/or energy-sensitive layer 12. Multi-layer mask 20 may subsequently be re-used.

Due to the exposure of energy-sensitive material 12 to electron beam 50 in step (3) of FIG. 1, exposed energy-sensitive material 12A may be removed from substrate 10 through a development process thereby providing one or more features 30. In other embodiments, depending on the composition of energy-sensitive material 12, exposed energy-sensitive material 12A could remain on substrate 10 (e.g. after exposure to electron beam 50) and non-exposed energy-sensitive material 12B could be removed from substrate 10 to provide features 30. Features 30 may be complementary in shape to feature apertures 23.

In some embodiments (e.g. where energy-sensitive material 12 is a positive resist), energy-sensitive material 12 undergoes a chemical change by exposure to electron beam 50 and the portion of energy-sensitive material 12 that has undergone this chemical change due to the exposure to electron beam 50 remains after subsequent development while the portion that has not undergone a chemical change due to exposure to electron beam 50 is removed by the subsequent development. In some embodiments (e.g. where energy-sensitive material 12 is a negative resist), energy-sensitive material 12 undergoes a chemical change by exposure to electron beam 50 and the portion of energy-sensitive material 12 that has undergone chemical change due to exposure to electron beam 50 is removed by subsequent development while the portion that has not undergone a chemical change remains after development. In the illustrated embodiment of FIG. 1, exposed energy-sensitive material 12A is removed from substrate 10.

The development process may comprise any suitable development method such as, for example, those used in previous electron beam lithography techniques. For example, methyl isobutyl ketone (MIBK) may be employed to develop energy-sensitive material 12. Development may comprise immersing the electron exposed energy-sensitive material 12 in a solution of MIBK and isopropyl alcohol, (mixed in a ratio of approximately 1:3) and allowing it to sit for approximately 30 seconds (e.g. 15-45 seconds) before rinsing it with de-ionized water. Development may be dependent on the composition of energy-sensitive material 12.

In some particular embodiments:
1. A clean silicon wafer with a native oxide layer is employed as substrate 10.
2. A spin coat of energy-sensitive material (resist) 12 (e.g. 200 nm of PMMA A-6 or 50 nm of PMMA-A-2) is applied to substrate 10.
3. Multi-layer mask comprises a commercially available mask from Aquamarijn Micro Filtration BV with an added gold layer (e.g. second mask layer 24).
4. Energy-sensitive layer 12 is exposed through multi-layer mask 20 using an electron beam 50 comprising a SEM electron beam (e.g. the FEI/Aspex Explorer SEM or FEI Nova Nano SEM electron beam at low magnification).
5. Exposed energy-sensitive material 12A is developed (e.g. using Methyl isobutyl ketone (MIBK)) according to known development techniques.

Steps 1-5 may be iterated. Such iterations may vary some parameters, such as (without limitation): beam current, acceleration voltage, spot size, dwell time, feature aperture dimensions, mask layer thicknesses. Beam current, acceleration voltage, spot size, dwell time parameters may be changed by adjusting the current and voltage to the electron source, the magnetic lenses, and modifying the apertures through which the electrons are focused and guided. A goal of changing these parameters is to maximize the contrast between the regions of the energy-sensitive layer that are exposed through feature apertures 30 and the regions that are protected from exposure by the first and second mask layers 22, 24. Maximizing electron exposure contrast allows for a maximum possible resolution of REAM exposed developed surface patterns.

Increasing beam current may cause the energy-sensitive material 12 to undergo the desired chemical change more quickly. However, increasing the beam current or dose of electrons can overexpose energy-sensitive material 12 leading to larger features 30. In extreme circumstances, overexposing energy-sensitive material 12 can cause portions of energy-sensitive material 12 under the masked area (e.g. portions protected by multi-layer mask 20) to be exposed as well. In some cases, extreme overexposure of PMMA can lead to chemical changes that cause PMMA to behave like a negative tone resist instead of a positive tone resist. Decreasing the beam current may have the effect of increasing the exposure time to chemically change energy-sensitive material 12.

Increasing beam energy may change the rate of chemical changes in energy-sensitive material 12. The nature of such a change may be dependent on the material chosen. Increasing beam energy may increase the number of electrons that penetrate multi-layer mask 20 thereby exposing unwanted areas of energy-sensitive material 12. Decreasing the beam energy may change the exposure dose of energy-sensitive material 12 in a way related to its underlying chemistry. Decreasing the beam energy may decrease the number of electrons that penetrate the multi-layer mask 20.

The inventors conducted experiments to investigate the process parameter window of the Rapid Electron Area Masking (REAM) lithography technique described herein. Experiments were conducted on substrates 10 comprising silicon wafers coated with 50 nm of thermally evaporated aluminum. Substrates 10 were variously coated with energy-sensitive layers 12 comprising a solution of polymethyl methacrylate (e.g. PMMA A2 and PMMA A6 from Microchem) in anisole, at thicknesses of 50 nm or 200 nm respectively.

The energy-sensitive material 12 coated substrates 10 were masked with multi-layer masks 20 comprising a commercially available Aquamarijn Micro Filtration BV mask (which comprised first and third mask layers 22, 26) with an added gold layer (e.g. second mask layer 24). The first mask layer 22 of the Aquamarijn Micro Filtration BV mask was a silicon nitride mask layer patterned with periodic hexagonal arrays of 450 nm holes with a 900 nm period (see FIG. 5A). Second mask layer 24 comprised 50 nm of gold coated onto first mask layer 22 through thermal evaporation.

Exposure conditions were surveyed using two SEM instruments as electron sources. Exposure conditions were probed on an FEI/Aspex Explorer (variable pressure SEM) instrument to take advantage of its very high beam current and large spot size afforded by the uncomplicated filament source. It was thought that these qualities would enable extremely rapid exposures over the entire area of the approximately 5 mm×5 mm nanostencil mask area. A second set of experiments was conducted using the FEI Nova NanoSEM (scanning electron microscope). This instrument's precise control over beam current afforded more precise resist dose control, but involved relatively small exposure areas due to the device's relatively low beam current. The masked substrates were exposed at energies between 1 keV and 25 keV at a variety of spot sizes. Exposure doses were controlled through selecting appropriate raster speeds and resolution and selected to approximate the vendor recommended dose of approximately 50-500 $\mu C/cm^2$ for positive resist exposure or above 3 $mC/cm^2$ for negative tone PMMA exposure conditions.

The samples (e.g. energy-sensitive material 12 of the samples) were developed in MIBK 1:3 isopropyl alcohol developer for 30 seconds and rinsed with de-ionized water for 3 minutes. Resultant patterned samples were further imaged using electron microscopy to determine pattern fidelity and overall quality.

Figure 3A:
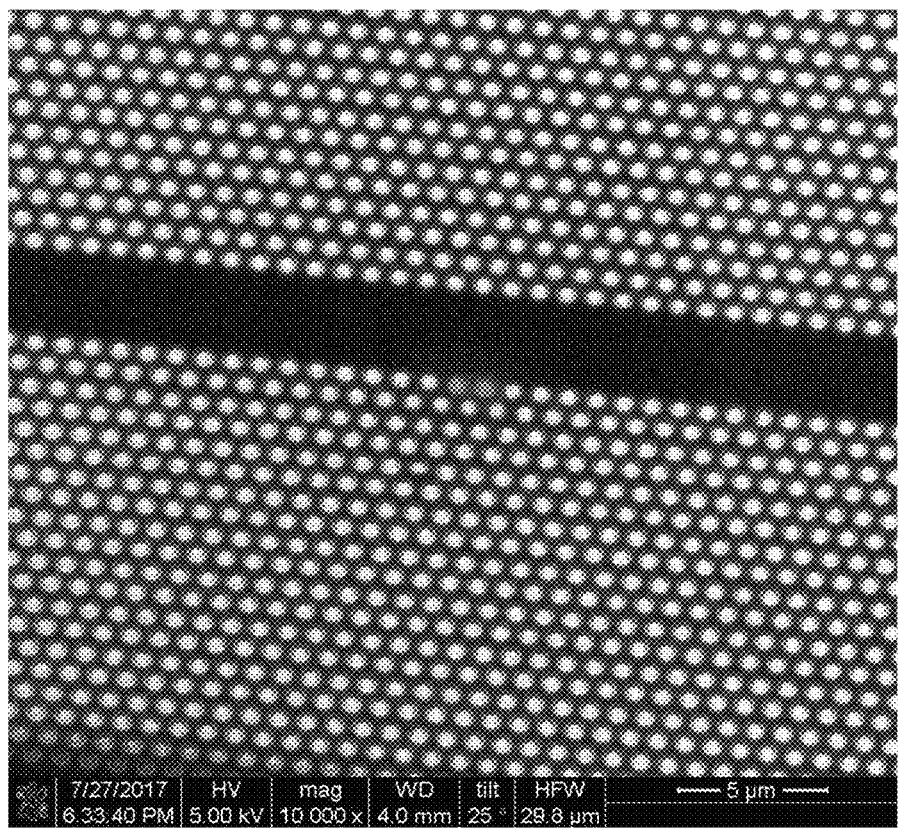
FIG. 3A shows a wide view of a polymethyl methacrylate (PMMA) layer patterned with an Aquamarijn Micro Filtration BV multi-layer mask.
Figure 3B:
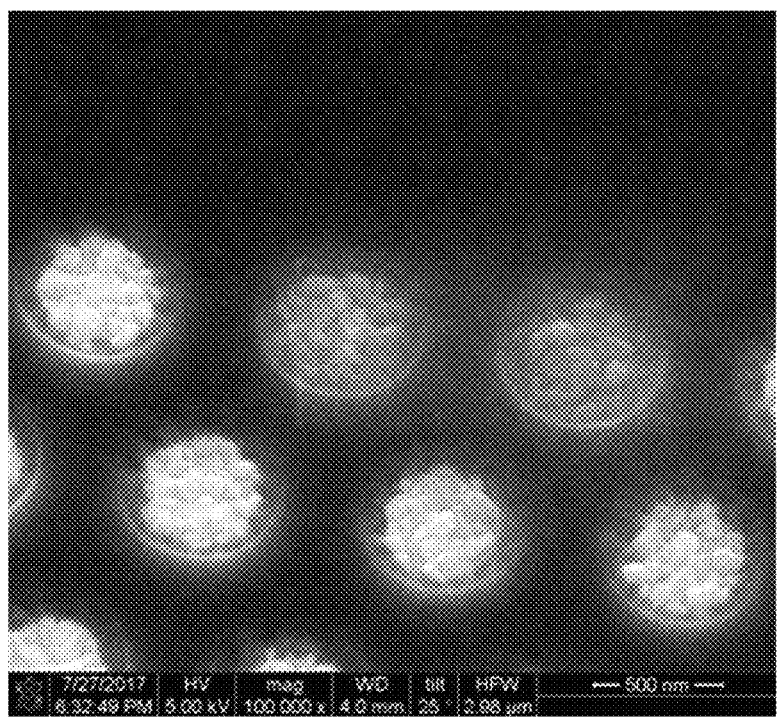
FIG. 3B shows a tilted magnified view of a PMMA layer patterned with an Aquamarijn Micro Filtration BV multi-layer mask.

The eventual quantification of the REAM lithography process window was accomplished using the FEI Nova Nano SEM. This instrument enabled accurate measurement of beam current and exposure times at the expense of beam power and practical exposure area limitations. The exposure protocols revealed that REAM patterned features 30 on PMMA A6 coated substrates 10 were well exposed and developed into PMMA positive tone resist features 30 at electron beam powers of 15 keV and exposure doses of between 200 and 400 µC/cm2 (see FIGS. 3A and 3B). FIG. 3A shows a wide field view SEM image of REAM patterned PMMA positive tone resist layers showing high contrast aluminum film underlayer. FIG. 3B shows a tilted magnified view SEM image of REAM patterned PMMA positive tone resist layers showing high contrast aluminum film underlayer.

Figure 4A:
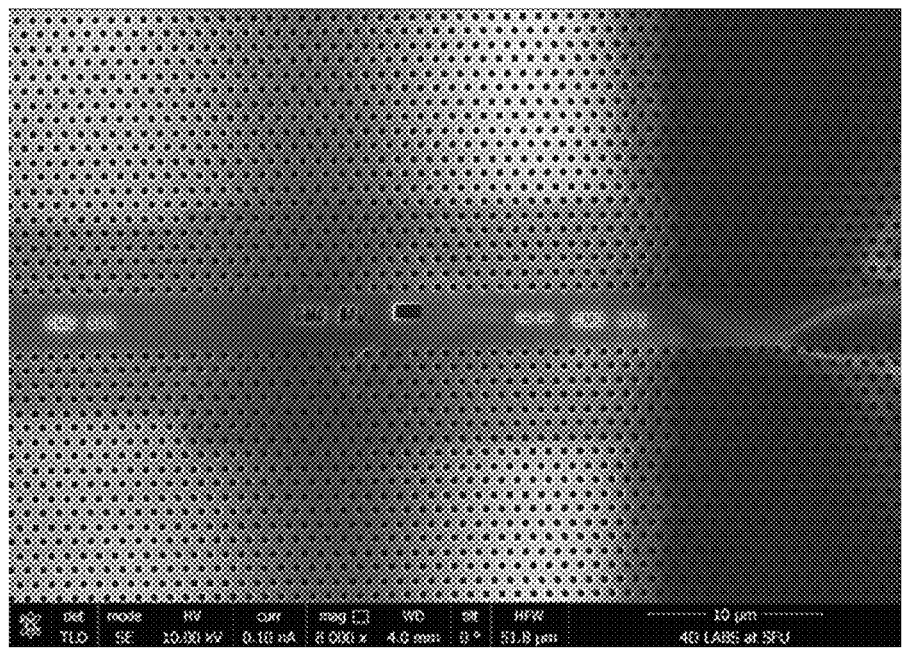
FIG. 4A depicts an Aquamarijn Micro Filtration BV multi-layer mask patterned by focused ion beam (FIB).
Figure 4B:
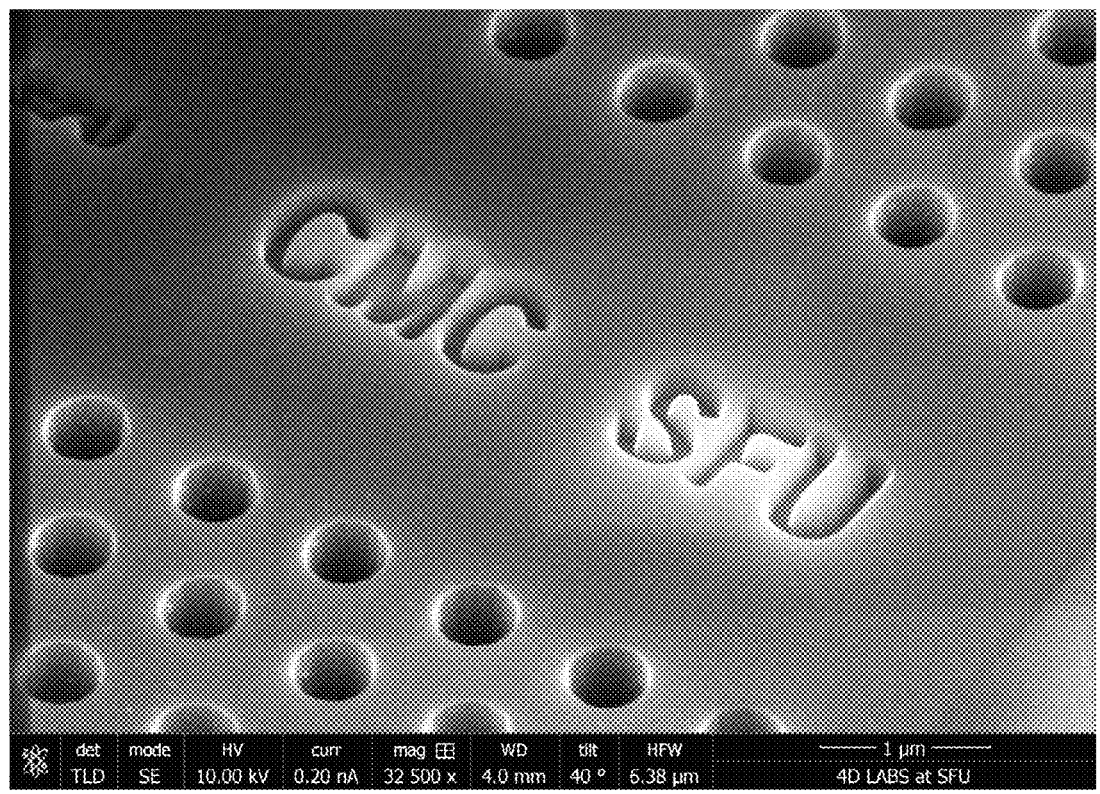
FIG. 4B depicts a tilted magnified view of the multi-layer mask of FIG. 4A.

A Helios SEM FIB (Focused Ion Beam), a high-resolution scanning electron microscope column with a fine-probe ion source, was used to mill features into the nanostencil membrane to generate relatively small test features that could be exposed by the previously described technique. Charging effects were mitigated through the use of in-situ platinum coating of the stencil surface (see FIGS. 4A and 4B). FIG. 4A shows a wide field view of FIB patterning of a nanostencil membrane. FIG. 4B shows a tilted magnified view of FIB patterning of a nanostencil membrane.

In some particular embodiments:
1. A clean silicon (100) wafer coated with metal (e.g. Ag or Al) is employed as substrate 10.
2. A spin coat of energy-sensitive material (resist) 12 (e.g. 200 nm of PMMA A-6 or 50 nm of PMMA-A-2) is applied to substrate 10.
3. Multi-layer mask comprises a commercially available mask from Aquamarijn Micro Filtration BV with an added gold layer (e.g. second mask layer 24) or a custom fabricated REAM mask fabricated using the FIG. 2 method.
4. Energy-sensitive layer 12 is exposed through multi-layer mask 20 using a SEM electron beam 50 (e.g. the FEI/Aspex Explorer SEM or FEI Nova Nano SEM electron beam at low magnification).
5. Exposed energy-sensitive material 12A is developed (e.g. using Methyl isobutyl ketone (MIBK)) according to known development techniques.

Steps 1-5 may be iterated. Such iterations may vary some parameters, such as (without limitation): beam current, acceleration voltage, spot size, dwell time, feature aperture dimensions, mask layer thicknesses, as described further herein.

The inventors conducted experiments to investigate the minimum critical dimensions (also referred to as minimum feature size) of the Rapid Electron Area Masking (REAM) lithography techniques described herein.

Figure 5A:
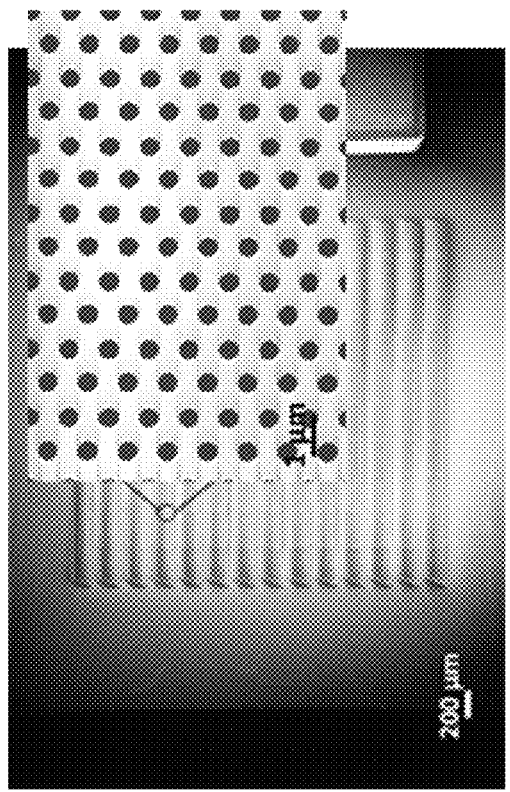
FIG. 5A depicts an Aquamarijn Micro Filtration BV multi-layer mask. The inset of FIG. 5A depicts a magnified view of a portion of the Aquamarijn Micro Filtration BV multi-layer mask of FIG. 5A.
Figure 5B:
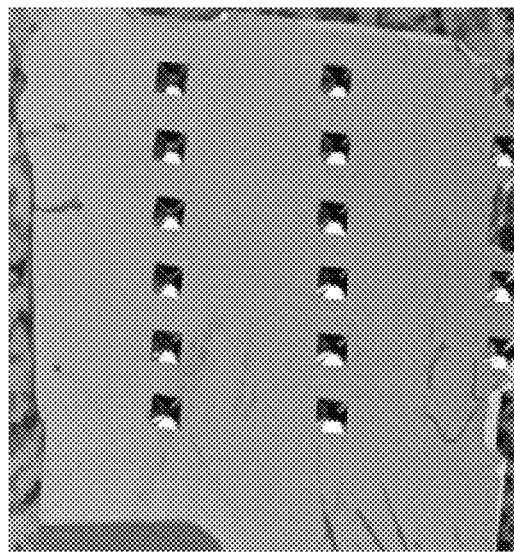
FIG. 5B depicts a custom REAM multi-layer mask.
Figure 5C:
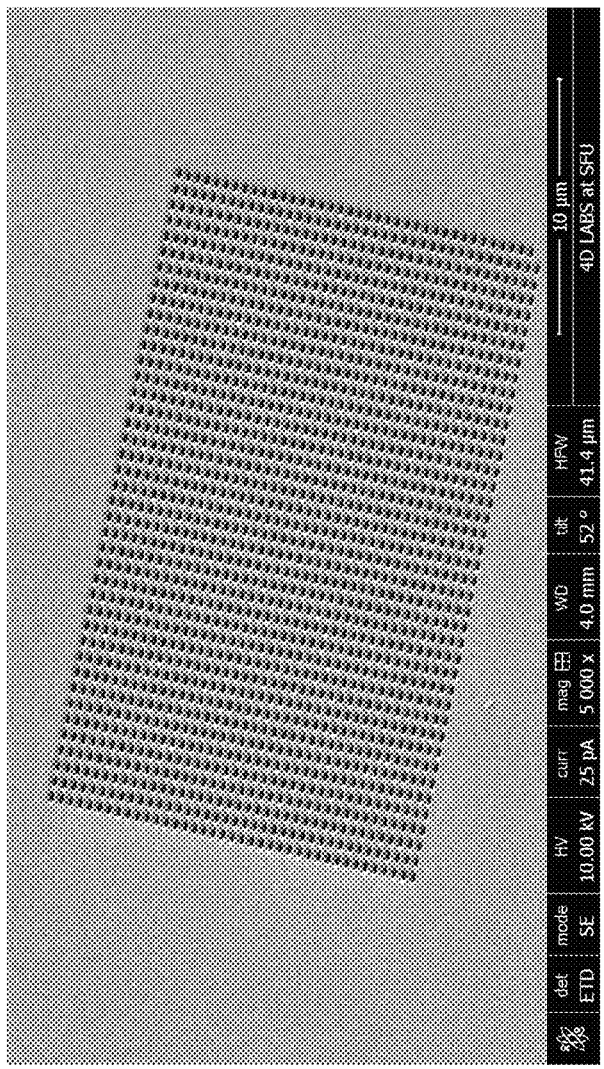
FIG. 5C depicts a magnified view of a portion of the custom REAM multi-layer mask of FIG. 5B.

Experiments were conducted on substrates 10 comprising silicon wafers coated alternatively with 50 nm of thermally evaporated aluminum or 500 nm of silver. Substrates 10 were variously coated with energy-sensitive layers (resists) 12 comprising PMMA A2 or PMMA A6 (Microchem) at thicknesses of 50 nm and 200 nm respectively. The energy-sensitive material 12 coated substrates 10 were masked with multi-layer masks 20 comprising either a commercially available Aquamarijn Micro Filtration BV mask (which comprised first and third mask layers 22, 26) with an added gold layer (e.g. second mask layer 24) or with a custom fabricated REAM mask (see FIGS. 5B and 5C). The Aquamarijn membranes were patterned with periodic hexagonal arrays of 450 nm holes with a 900 nm period as shown in FIG. 5A. The custom designed REAM masks were patterned on 100 nm stress free silicon nitride membranes suspended across an silicon (100) scaffold that was etch patterned with KOH anisotropic etchant (see FIGS. 5B and 5C). The top surface of the custom REAM mask was coated with a second masking layer 24 comprising 50 nm of gold through thermal evaporation.

The custom REAM masks were fabricated from a silicon (100) wafer coated in 100 nm thick thermally grown low-stress silicon nitride film (see step (1) of FIG. 2). The backside of the wafer was etched through an approximately 3 mm steel shadow mask in a reactive ion etcher to remove the backside silicon nitride coating and expose the backside of 26B of the silicon wafer. The exposed silicon was etched with KOH down to the front side of silicon nitride surface 22A (see step (2) of FIG. 2), generating a silicon (e.g. third mask layer 26) supported silicon nitride membrane (e.g. first mask layer 22). The sample was coated with a 50 nm thick gold film (e.g. second mask layer 24) by thermal evaporation, covering the backside 26B of the silicon wafer and the exposed silicon nitride first layer 22A (see step (3) of FIG. 2). The feature apertures 23 in the first and second mask layers 22, 24 were then patterned using focused ion beam lithography (see step (4) of the FIG. 2 method and FIGS. 5B and 5C). This fabrication method is not optimized and was selected for the purposes of rapidly iterating to optimize electron beam parameters for PMMA exposure.

Figure 10:
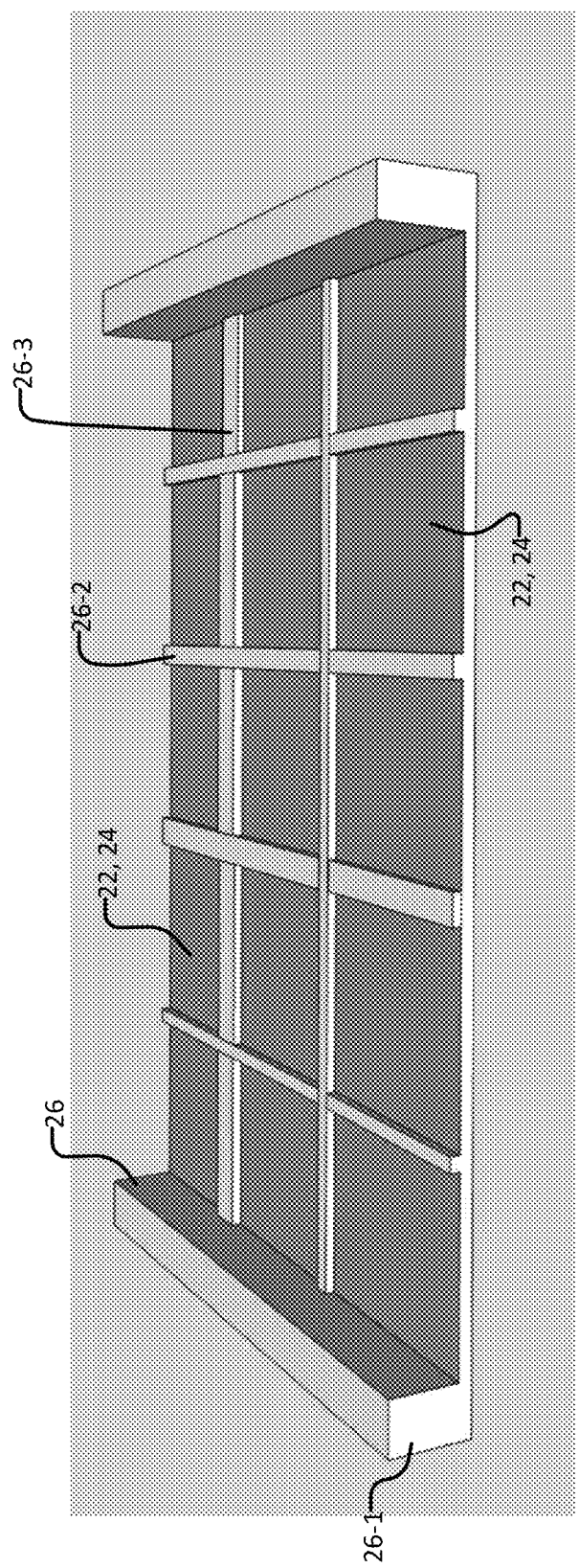
FIG. 10 is a schematic depiction of an exemplary multi-layer mask according to one embodiment of the invention.

In some embodiments, scaffolding layer 26 of the REAM mask is fabricated with multiple scales (e.g. thicknesses). For example, third scaffolding mask layer 26 can be made to support larger areas of first and second mask layers 22, 24 by fabricating a smaller dimension silicon scaffold 26 supported and surrounded by a thicker silicon scaffold 26 that affords the complete mask the mechanical strength that is beneficial for handling. For example, FIG. 10 shows a multi-layer mask 20 comprising first and second mask layers 22, 24 and a third scaffolding mask layer 26 having a variable thickness. For example, it can be seen that portion 26-1 of third scaffolding mask layer 26 has a greater thickness than portion 26-2 of third scaffolding mask layer 26 and portion 26-3 of third scaffolding mask layer 26. A variable scale or thickness third scaffolding mask layer 26 may be desirable to facilitate achieving a sufficiently supportive scaffolding layer 26 for first and second mask layers 22, 24 while also reducing mass and cost of scaffolding layer 26.

Minimum REAM critical dimensions (also referred to as minimum feature size) were surveyed using two SEM instruments as electron sources. Critical dimensions were probed using a FEI Nova NanoSEM, in the case of aluminum coated substrates. Critical dimensions were probed using a Helios SEM FIB for the silver coated substrates. The masked substrates were exposed at energies of 15 keV at a variety of spot sizes. Exposure doses were controlled through selecting appropriate raster speeds and resolution and selected to approximate the vendor recommended dose of approximately 50-500 µC/cm2 for positive resist exposure 1. The samples were developed in MIBK 1:3 IPA developer for 30 seconds and rinsed with de-ionized water for 3 minutes. Resultant patterned samples were further imaged using electron microscopy to determine pattern fidelity and overall quality.

Figure 6A:
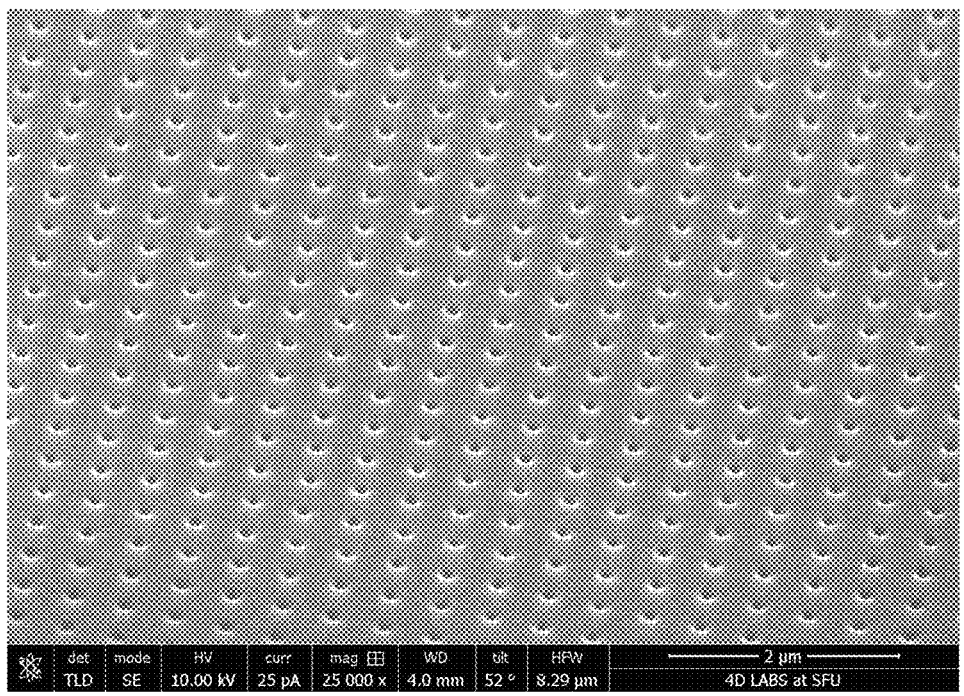
FIG. 6A depicts a wide field view of a first mask layer with an aperture array.
Figure 6B:
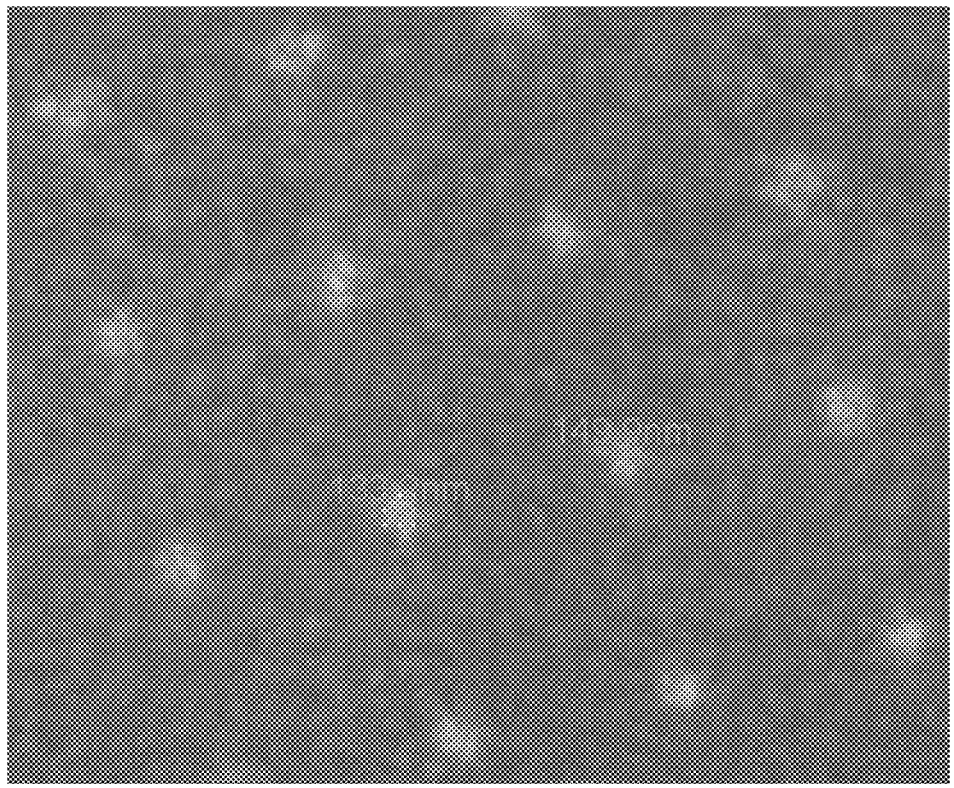
FIG. 6B depicts a magnified view of a portion of a PMMA layer with an aluminum pattern according to the aperture array of FIG. 6A.

The critical dimension of the REAM process was first explored with aluminum coated silicon substrates. Custom fabricated REAM masks with arrays of apertures of a variety of sizes down to 60 nm were exposed. Exposure was achieved by rastering an approximately 10 picoamp, 15 kiloelectronvolt SEM beam spot over a 148 micron half full width field of view for 10 to 30 seconds. It is estimated that this corresponded to a dose similar to what is used for exposure of PMMA on aluminum in a traditional electron beam lithography instrument. The critical dimension of the resultant features was limited by the polydisperse grain structure of the Aluminum film and was measured at approximately 130 nm (see FIGS. 6A and 6B).

Figure 7A:
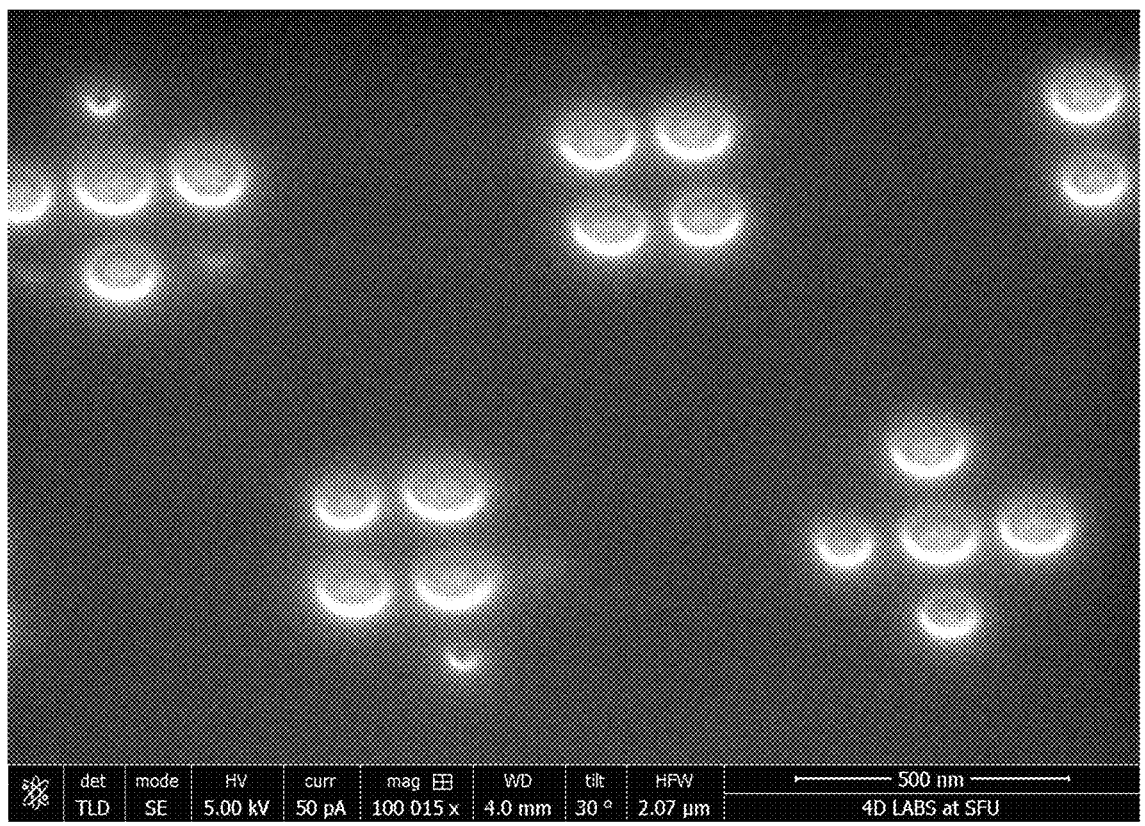
FIG. 7A depicts a PMMA layer after development.
Figure 7B:
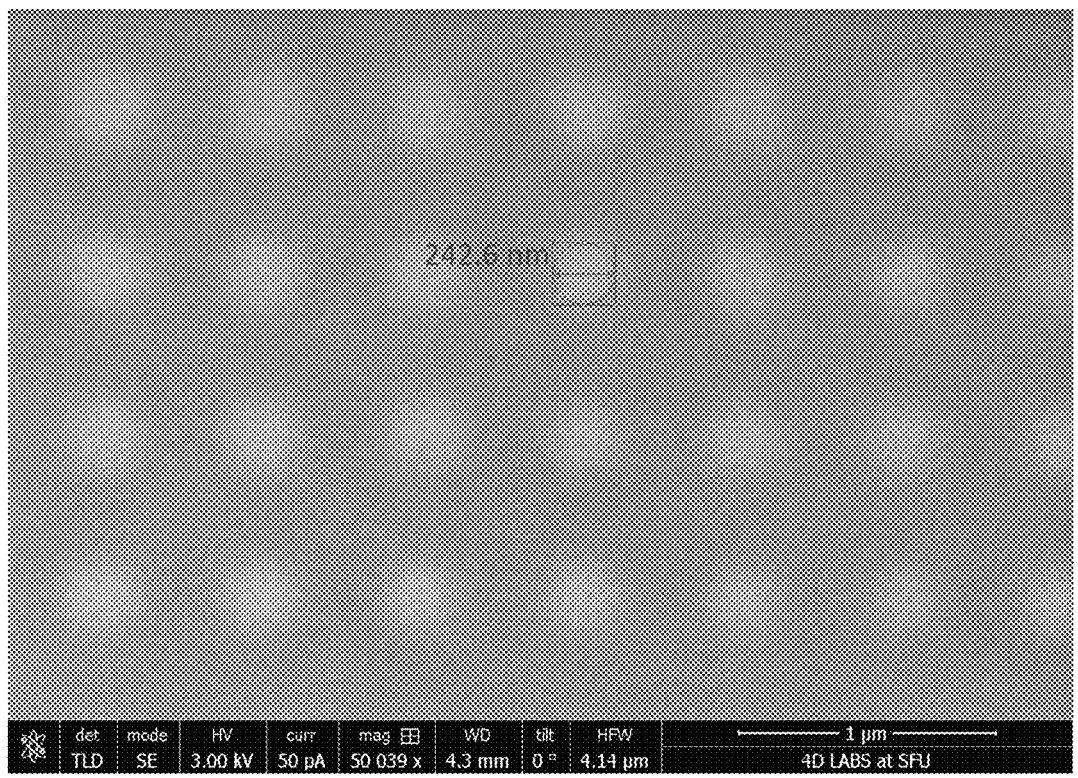
FIG. 7B depicts another PMMA layer after development.

The critical dimension of the REAM process was next explored with silver coated silicon substrates. A critical dimension of 50 nm was observed after exposure of a modified nanostencil and custom fabricated REAM mask (see FIG. 7A). FIG. 7B depicts approximately 50 nm wide circular features in PMMA resist after development. These features were created with a 32 pA 15 keV SEM electron beam rastered over a REAM mask surface.

The REAM technology described herein has a number of applications. The REAM technology described herein may enable many new technologies such as those that depend on low cost, large area, and/or rapid patterning of features below the diffraction limit of light. Low cost patterning over large areas is applicable in, for example, the fields of metamaterial optics and plasmonics, such as windows and surfaces with designed transmissive and absorptive properties, flat optics, optoelectronic devices, and plasmonic back reflectors for photovoltaics. Other non-limiting applications include nanocapillary fuel cells, microfluidic reactors and high surface area heterogeneous catalysis of chemical reactions. REAM technology could also be of use in the manufacture of traditional microelectronics and for large area electronics and displays.

Figure 8A:
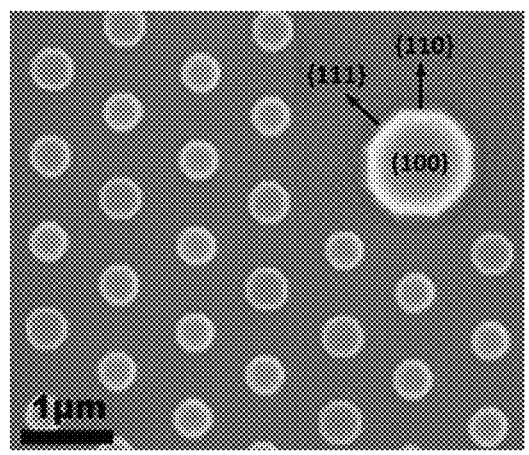
FIG. 8A shows a top view of a plasmonic metasurface that can be formed through REAM lithography.
Figure 8B:
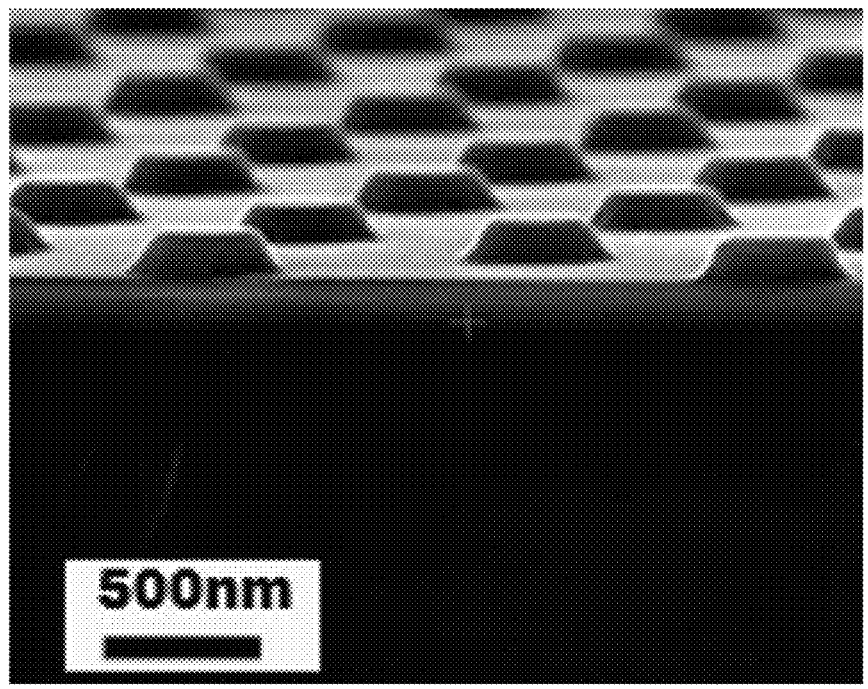
FIG. 8B shows a tilted view of a plasmonic metasurface that can be formed through REAM lithography.

One non-limiting application of REAM relates to photovoltaic devices of the type which may be used, for example, in solar cells. The application of REAM technology to photovoltaic devices has broad utility for the manufacture of efficient and lightweight silicon based solar cells. One such application involves the generation of sub-micron patterns of plasmonic materials over large areas. Plasmonic materials comprise a range of materials including dielectrics, metals, and their combinations. REAM may be employed to form a plasmonic material nano-patterned surface that efficiently couples to an incident photon and confines the energy of the electromagnetic wave to the near surface region of the plasmonic material's surface. An example of such a nanostructured surface is depicted in FIGS. 8A and 8B. FIG. 8A shows a top view of a plasmonic metasurface that can be formed through REAM lithography. FIG. 8B shows a cross section of a plasmonic metasurface that can be formed through REAM lithography. The FIGS. 8A and 8B plasmonic metal surface comprises a continuous single crystal silver film decorated with silver single crystal nanopillars. REAM technology, as described herein, could be used to generate such features over large areas.

Figure 9:
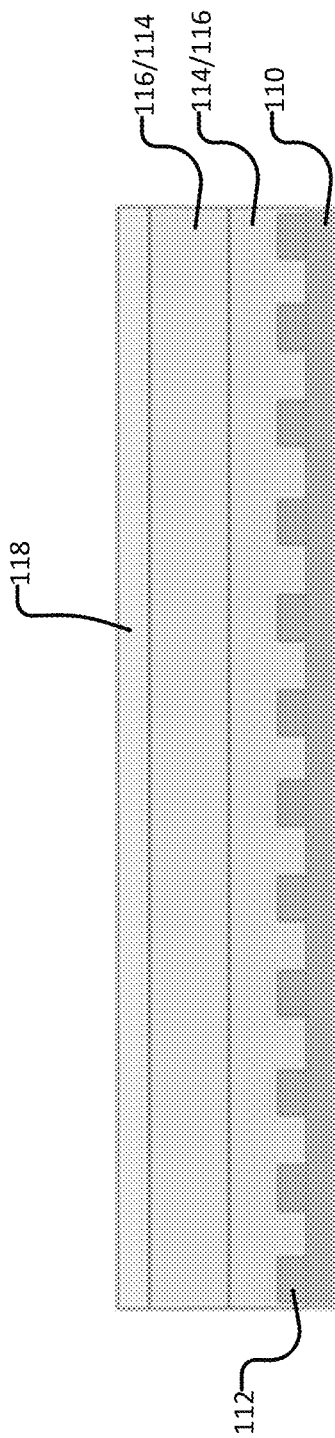
FIG. 9 is a schematic depiction of an exemplary REAM deposited plasmonic nanostructure employable for thin film silicon photovoltaics, according to one aspect of the invention.

The combination of silver nanostructures on silver films is of interest because these structures can be made to capture the solar spectrum efficiently. These structures can also make a unique substrate for the deposition of silicon at elevated temperatures. When heated to 350° C. the substrate depicted in FIGS. 8A and 8B may provide an interface for the epitaxial deposition of silicon on silver. One method of depositing epitaxial silicon on silver is through thermal evaporation. Another method of depositing epitaxial silicon on silver is through electron beam evaporation at 350° C. Epitaxially grown single crystal silicon is of low defect density and has a long electron hole pair diffusion length which decreases recombination losses and improves photovoltaic efficiency. The utility of such a design may be further enhanced by the plasmonic nature of the nano-patterned surface. FIG. 9 shows how REAM deposited plasmonic nanostructures can enable efficient thin film silicon photovoltaics. The plasmonic structures 112 trap incident light and generate large electric fields in the near surface silicon overlayer. Such an overlayer fabricated by REAM may be designed to contain two regions of different majority charge carriers (e.g. an n-doped epitaxial silicon layer 104 and a p-doped epitaxial silicon layer 116) may be made thinner than traditional photovoltaic devices as the incident energy may be concentrated in a thin region (less than 1 micron thick) near the surface of the plasmonic absorbing element 110. Charges generated in the silicon would migrate to the top contact 118 or the plasmonic back reflector and be collected to generate electricity (see FIG. 9).

Large area nanopatterns may be designed to interact with light in the near field to thereby enable the excitation of near surface electric fields that impart properties to transmitted, reflected, and scattered light in valuable ways. This field of inquiry is often referred to as the science of metamaterials. Currently the high cost of nano-patterning surfaces over large areas limits the application of metamaterial technology to extremely expensive devices and basic research. REAM technology may be used to pattern metamaterials over large areas rapidly at low cost.

Another non-limiting application of REAM technology relates to architectural glass. Patterning glass with light-interacting surface features can impart properties to the window of great value in building construction. REAM methods described herein may be employed to pattern glass surfaces with light-interacting surface features. In some embodiments, the light-interacting surface features may comprise, but are not limited to, subwavelength-spaced and optically thin elements (e.g. to form a metasurface). This allows for architectural glass with passive light modulation designs to generate colours, images, angle dependent scattering, absorption, transmission and/or reflection of light. For example, glass pattern with light-interacting surfaces patterned by REAM can be employed as windows that reject light incident at high angles (in summer when the sun is high in the sky) and allow light to be transmitted at low incident angles (in winter when the sun in close to the horizon).

Another non-limiting application of REAM relates to flat optics. REAM patterning may enable low-cost fabrication of metamaterial surfaces that mimic traditional thick, curved and/or multi component optical devices in flat, thin, discreet geometries. REAM may be employed to pattern such arrays of subwavelength-spaced and optically thin elements. Metasurfaces are arrays of subwavelength-spaced and optically thin elements that can enable new physical phenomena that are distinctly different from those observed in three-dimensional (3D) bulk metamaterials and in conventional bulk optical materials. Metasurfaces can therefore provide the capability to control the phases, amplitudes, and polarizations of electromagnetic wavefronts with planar elements to realize "planar photonics" often referred to as "flat optics". Non-limiting examples of such devices include flat lenses, beam splitters, spatial filters, etc.

Another non-limiting application of REAM relates to optoelectronic and photochemical devices. Nanostructures fabricated using REAM patterning may be designed to exploit the coupling of incident light to surface excitations, and/or can mediate and enhance the conversion of light energy into electrical and chemical energy. REAM patterning can be used to enhance the utility of existing optoelectronic devices. One non-limiting example of such an application is the use of REAM patterning to form light absorbing plasmonic back reflectors on solar cells. Increased absorption afforded by these surface patterns may give rise to higher efficiency photovoltaic conversion and lower the minimum thickness of silicon needed in manufacturing the cells.

Another optoelectronic device improvement enabled by REAM patterning allows the photochemical and photovoltaic harvesting of light energy through the capture of hot electrons generated during the decay of surface plasmons excited on designed REAM patterned surfaces. Hot electron energy can be used to generate voltage and current in plasmonic solar cells. The technique can enable plasmonic hot electron photo detectors with designed detection bandwidths, including detectors designed to respond to light in the infra-red below the 1.1 eV bandgap of silicon. Along with optoelectronic applications, hot electrons generated from REAM-patterned surfaces can be captured in the form of chemical energy through the transformation of molecules near the surface of the REAM patterned device. Such applications include conversion of $CO_2$ to other carbon compounds that can represent valuable chemical feedstocks, electrochemical water splitting for the production of hydrogen gas, reduction of metal salts onto surfaces, and/or chemical conversion through hot electron-mediated processes. These processes can also be mediated by resonant energy transfer from an excited REAM-patterned surface to a reactant of interest without hot electron mediation under some conditions.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are consistent with the broadest interpretation of the specification as a whole.

Interpretation of Terms

Unless the context clearly requires otherwise, throughout the description and the

- "comprise", "comprising", and the like are to be construed in an inclusive sense, as opposed to an exclusive or exhaustive sense; that is to say, in the sense of "including, but not limited to";
- "connected", "coupled", or any variant thereof, means any connection or coupling, either direct or indirect, between two or more elements; the coupling or connection between the elements can be physical, logical, or a combination thereof; elements which are integrally formed may be considered to be connected or coupled;
- "herein", "above", "below", and words of similar import, when used to describe this specification, shall refer to this specification as a whole, and not to any particular portions of this specification;
- "or", in reference to a list of two or more items, covers all of the following interpretations of the word: any of the items in the list, all of the items in the list, and any combination of the items in the list;
- the singular forms "a", "an", and "the" also include the meaning of any appropriate plural forms.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e. that is functionally equivalent), including components which are not structurally equivalent to the disclosed structure which performs the function in the illustrated exemplary embodiments of the invention.

Specific examples of methods and systems have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

As will be apparent to those skilled in the art in light of the foregoing disclosure, many alterations and modifications are possible in the practice of this invention without departing from the spirit or scope thereof.

The invention claimed is:

1. A method for electron beam lithography, the method comprising:
   fabricating a multi-layer mask; and
   interposing the multi-layer mask between an electron beam and an energy-sensitive layer to thereby expose the enemy-sensitive layer to the electron beam through the mask;
   wherein fabricating the multi-layer mask comprises: providing a first mask layer fabricated from a first mask material which defines one or more feature apertures corresponding to features of interest; and coating an electron-energy-reducing material onto the first mask layer to thereby provide a second mask layer,
   wherein the first mask layer is fabricated from a material with residual stress in the range of −1.0 GPa to 1.0 GPa.

2. The method according to claim 1, wherein the electron-energy-reducing material is capable of at least one of: scattering electrons; and absorbing electrons.

3. The method according to claim 1, wherein the first mask layer is electrically insulating, relative to the second mask layer.

4. The method according to claim 1, wherein the first mask layer comprises silicon nitride.

5. The method according to claim 1, wherein the one or more feature apertures have maximum dimensions less than 50 nm.

6. The method according to claim 1, wherein the one or more feature apertures have maximum dimensions less than 10 nm.

7. The method according to claim 1, wherein the second mask layer comprises one or more metals.

8. The method according to claim 1, wherein the second mask layer comprises one or more metal oxides.

9. The method according to claim 1, wherein the second mask layer comprises gold (Au).

10. The method according to claim 1, wherein the electron beam has an energy greater than 10 ke V.

11. A method of fabricating flat optics devices comprising: patterning light-interacting surface features on a substrate according to the method of claim 1.

12. The method according to claim 1, wherein fabricating the multi-layer mask comprises: providing a third scaffolding mask layer fabricated from a third mask material.

13. The method according to claim 12, wherein the third scaffolding mask layer is on a side of the second mask layer opposite from the first mask layer.

14. The method according to claim 12, wherein the third scaffolding is between the first mask layer and the second mask layer.

15. The method according to claim 12, wherein the third scaffolding mask layer is fabricated from one or more of: silicon and oxides of silicon.

16. The method according to claim 12, wherein the third scaffolding mask layer defines one or more scaffolding.

17. The method according to claim 16, wherein the one or more scaffolding apertures are larger in cross-sectional area than the one or more feature apertures.

18. The method according to claim 17, wherein the one or more scaffolding apertures have cross-sectional dimensions which are greater than the one or more feature apertures.

19. A method for electron beam lithography, the method comprising:
fabricating a multi-layer mask; and
interposing the multi-layer mask between an electron beam and an energy-sensitive layer to thereby expose the energy-sensitive layer to the electron beam through the mask;
wherein fabricating the multi-layer mask comprises: providing a first mask layer fabricated from a first mask material which defines one or more feature apertures corresponding to features of interest; and coating an electron-enemy-reducing material onto the first mask layer to thereby provide a second mask layer,
wherein the first mask layer is fabricated from a first material with residual stress in the range of −1.5 GPa to 0 GPa and a second material with residual stress in the range of 0 GPa to 1.5 GPa.

20. A method of fabricating a photovoltaic device, the method comprising:
fabricating a plasmonic metal surface comprising a film and a plurality of plasmonic absorbing elements extending from a surface of the film using a method comprising:
fabricating a multi-layer mask; and
interposing the multi-layer mask between an electron beam and an energy sensitive layer to thereby expose the energy-sensitive layer to the electron beam through the mask;
wherein fabricating the multi-layer mask comprises: providing a first mask layer fabricated from a first mask material which defines one or more feature apertures corresponding to features of interest; and coating an electron-energy-reducing material onto the first mask layer to thereby provide a second mask layer;
fabricating an overlayer over the plasmonic metal surface, the overlayer comprising a p-doped layer and an n-doped layer; and
fabricating a top contact over the overlayer.

* * * * *

UNITED STATES PATENT AND TRADEMARK OFFICE
CERTIFICATE OF CORRECTION

PATENT NO. : 10,896,805 B2
APPLICATION NO. : 16/374652
DATED : January 19, 2021
INVENTOR(S) : Gary William Leach et al.

It is certified that error appears in the above-identified patent and that said Letters Patent is hereby corrected as shown below:

In the Claims

Column 16, Line 40, Claim 1:
"the enemy-sensitive layer to the electron beam through"
Should read:
"the energy-sensitive layer to the electron beam through"

Column 18, Line 5, Claim 19:
"electron-enemy-reducing material onto the first mask"
Should read:
"electron-energy-reducing material onto the first mask"

Signed and Sealed this
Eighteenth Day of June, 2024

Katherine Kelly Vidal
*Director of the United States Patent and Trademark Office*